United States Patent [19]  
Aoyama et al.

[11] Patent Number: 4,809,046  
[45] Date of Patent: Feb. 28, 1989

[54] SEMICONDUCTOR MEMORY DEVICE

[75] Inventors: Keizo Aoyama, Yamato; Takahiko Yamauchi; Teruo Seki, both of Kawasaki, all of Japan

[73] Assignee: Fujitsu Limited, Kawasaki, Japan

[21] Appl. No.: 915,967

[22] Filed: Oct. 6, 1986

Related U.S. Application Data

[63] Continuation of Ser. No. 471,522, Mar. 2, 1983, abandoned.

[30] Foreign Application Priority Data

Mar. 3, 1982 [JP] Japan .................... 57-32236  
Mar. 3, 1982 [JP] Japan .................... 57-32233  
Mar. 3, 1982 [JP] Japan .................... 57-32234

[51] Int. Cl.$^4$ ............................ H01L 27/02  
[52] U.S. Cl. .......................... 357/41; 357/71; 365/182  
[58] Field of Search ........... 357/71, 41; 365/154, 365/182, 188

[56] References Cited

U.S. PATENT DOCUMENTS

| | | | |
|---|---|---|---|
| 3,808,475 | 4/1974 | Beulow et al. | 357/45 |
| 4,240,097 | 12/1980 | Raymond, Jr. | 357/51 |
| 4,376,983 | 3/1983 | Tsaur et al. | 357/59 |
| 4,453,175 | 6/1984 | Ariizumi et al. | 357/23.9 |
| 4,458,406 | 7/1984 | DeLamoneda et al. | 29/578 |

FOREIGN PATENT DOCUMENTS 0043244 7/1983 European Pat. Off. .  
3002343 7/1980 Fed. Rep. of Germany .  
56-100463 8/1981 Japan .................... 357/59  
2049276 5/1980 United Kingdom .  
2098799 2/1981 United Kingdom .

OTHER PUBLICATIONS

IEEE International Conference on Circuits and Computers, vol. 1 of 2, Oct. 1-3, 1980, pp. 4-11, "Future Directions in MOSFET Random Access Memories"  
European Search Report, The Hague, 9/19/85 Examiner: M. L. Odgers.  
IEEE Journal of Solid-State Circuits, vol. SC-15, No. 5, Oct. 1980, pp. 854-861, Ohzone et al., "An 8K×8 Bit Static MOS RAM Fabricated by n-Mo S/n-well CMOS Technology".

Primary Examiner—Andrew J. James  
Assistant Examiner—Mark Prenty  
Attorney, Agent, or Firm—Staas & Halsey

[57] ABSTRACT

A static-type semiconductor memory device having a three-layer structure: gate-electrode wiring lines being formed from a first conductive layer of, for example, polycrystalline silicon; word lines, ground lines, and power supply lines being formed from a second conductive layer of, for example, aluminum; and bit lines being formed from a third conductive layer of, for example, aluminum. The bit lines extending in a column direction, and the ground lines extending in a row direction. Thus, providing an improved degree of integration, an improved operating speed, an improved manufacturing yield, and a countermeasure for soft errors due to alpha particles.

13 Claims, 9 Drawing Sheets

Fig. 1

PRIOR ART

SEMICONDUCTOR MEMORY DEVICE

This is a continuation of co-pending application Ser. No. 471,522 filed on Mar. 2, 1983 and now abandoned.

BACKGROUND OF THE INVENTION

1. Field of the Invention

The present invention relates to a semiconductor memory device, and more particularly to a physical structure of a static-type semiconductor memory device.

2. Description of the Prior Art

Generally, a static-type semiconductor memory device comprises word lines, pairs of bit lines, power supply lines, and ground lines formed on an insulating layer, on a semiconductor substrate. At each cross point of these word lines and these pairs of bit lines, a static-type memory cell consisting of metal-insulator semiconductor (MIS) transistors is arranged. Each MIS transistor has a gate electrode which is in contact with a gate-electrode wiring line.

Conventionally, the word lines, the power supply lines, and the gate-electrode wiring lines are formed by a first conductive layer of, for example, polycrystalline silicon, and extend parallel to each other, the first conductive layer being formed, through an insulating layer, on a semiconductor substrate. The pairs of bit lines and the ground lines are formed by a second conductive layer of, for example, aluminum, and extend in a direction perpendicular to the direction of the word lines the second conductive layer being formed on an insulating layer on the first conductive layer. Accordingly, for each memory cell, there are four polycrystalline-silicon wiring lines in a row direction, i.e., a word line, a power supply line, and two gate-electrode wiring lines for two MIS transistors cross-coupled with each other; and there are three aluminum wiring lines in a column direction, i.e., a pair of bit lines and a ground line.

To improve the yield in manufacturing semiconductor memory devices or to improve the degree of integration of a semiconductor memory device, it is preferable that the number of lines, formed by one conductive layer and extending in one direction, be as small as possible to promote easy wiring. Also, in order to achieve higher speed access to a memory cell, it is preferable to use material having a high electrical conductivity for the word lines, pairs of the bit lines, and power supply lines.

In the conventional structure, however, since there are four polycrystalline-silicon lines in the row direction and three aluminum lines in the column direction, for each memory cell, there is a limit to the attainable ease of wiring, yield, and integration degree. Also, in the conventional structure, since the word lines and the power supply lines as well as the gate electrode wiring lines are simultaneously formed using the same conductive layer of polycrystalline silicon and since the resistivity of polycrystalline silicon is higher than that of good conducting material such as aluminum, high speed access is prevented.

From another point of view, recent advances in increasing the integration degree of semiconductor memory devices have resulted in a corresponding decrease in the amount of charge an individual memory cell can store. Therefore, countermeasures for soft errors due to alpha particles have become necessary not only for dynamic-type semiconductor memory devices, but also static-type semiconductor memory devices. Conventionally, static-type semiconductor memory devices have not been provided with countermeasures against soft errors due to alpha particles.

SUMMARY OF THE INVENTION

Accordingly, an object of the present invention is to provide a static-type semiconductor memory device which can operate at a high speed.

Another object of the present invention is to provide a static-type semiconductor memory device which has a high degree of integration.

Still another object of the present invention is to provide a static-type semiconductor memory device which can be manufactured with a high yield.

A still further object of the present invention is to provide a static-type semiconductor memory device in which wiring layers can easily be manufactured.

A still further object of the present invention is to provide a static-type semiconductor memory device in which soft errors due to alpha particles are limited.

In order to attain the above objects, there is provided, according to the present invention, a semiconductor memory device. The device contains a semiconductor substrate. A group of word lines formed on and insulated from the semiconductor substrate, as are a group of pairs of bit lines, a group of power supply lines and a group of ground lines. A plurality of static-type memory cells comprising MIS transistors cross-coupled with each other are provided at a cross point between one of the word lines and one of the pairs of bit lines. Each of the memory cells has a gate electrode a gate-electrode to which wiring lines is connected. The gate-electrode wiring lines are formed by a first conductive layer which is formed on a first insulating layer on the semiconductor substrate at least one group, among the group of word lines, the group of power supply lines, and the group of ground lines, is formed of a second conductive layer formed on a second insulating layer on the first conductive layer. The group of pairs of bit lines is formed of a third conductive layer formed on a third insulating layer on the first conductive layer.

One feature of the present invention is that the above-mentioned at least one group of lines formed of the second conductive layer extends in a row direction perpendicular to the extending column direction of the bit lines.

Another feature of the present invention is that all of the word lines, the power supply lines, and the ground lines are formed by the second conductive layer.

Still another feature of the present invention is that the first conductive layer has a first resistivity; the second conductive layer has a second resistivity lower than or equal to the first resistivity; and the third conductive layer has a third resistivity lower than the first resistivity.

A further feature of the present invention is that the first conductive layer is a polycrystalline-silicon layer; the second conductive layer is a tungsten layer, a molybdenum layer, an aluminum layer, or a polycrystalline-silicon layer; and the third conductive layer is an aluminum layer.

A still further feature of the present invention is that the group of the ground lines is formed by second conductive layer.

A still further feature of the present invention is that each of the ground lines is formed to cover at least a part of the drain regions of the MIS transistors.

A still further feature of the present invention is that each of the ground lines has a width smaller than the distance between two adjacent word lines and larger than the distance between two adjacent gate-electrode wiring lines in each row.

A still further feature of the present invention is that the semiconductor memory device further includes a group of ground-line short-circuiting lines formed by the third conductive layer, each of the ground-line short-circuiting lines extending through the memory cells arranged in predetermined columns and being in contact with the ground lines.

BRIEF DESCRIPTION OF THE DRAWINGS

The above objects and advantages as well as other features of the present invention will become more apparent from the following description of the embodiments when read in conjunction with the accompanying drawings, wherein.

DESCRIPTION OF THE PREFERRED EMBODIMENTS

Figure 1:
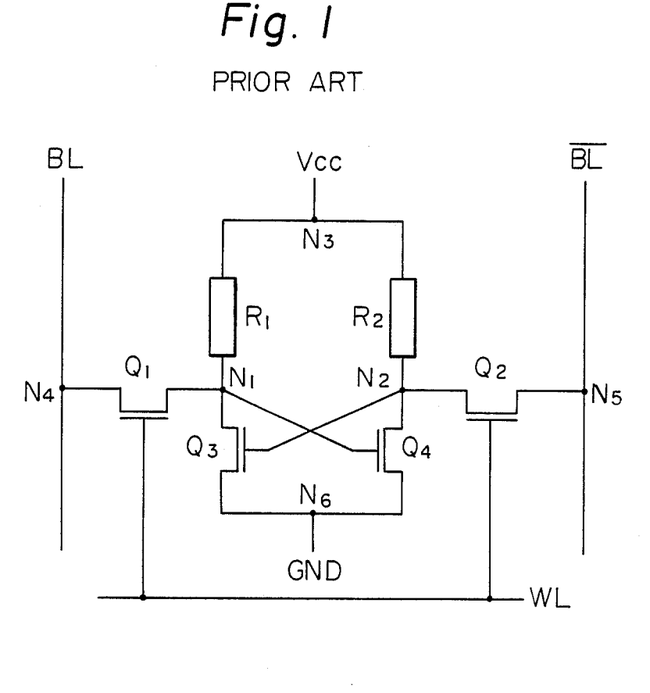
FIG. 1 is an equivalent circuit diagram of one memory cell in a well known static-type random access memory (RAM)

Before describing the embodiments of the present invention, a conventional static-type semiconductor memory device will first be described with reference to FIGS. 1 thrrough 4. FIG. 1 illustrates a well known static-type memory cell. In FIG. 1, memory selecting metal-oxide semiconductor (MOS) transistors $Q_1$ and $Q_2$ have gates commonly connected to a word line WL. The drains or sources of these transistors $Q_1$ and $Q_2$ are connected to bit lines BL and $\overline{BL}$, respectively. MOS transistors $Q_3$ and $Q_4$ are cross-coupled with each other and constitute a flip-flop. The drains of the MOS transistors $Q_3$ and $Q_4$ are connected, at nodes $N_1$ and $N_2$, to the sources (or drains) of the transistors $Q_1$ and $Q_2$, respectively. The nodes $N_1$ and $N_2$ are connected through respective load resistors $R_1$ and $R_2$ to a power supply line $V_{CC}$. The sources of the transistors $Q_3$ and $Q_4$ are commonly connected to a ground line GND.

Figure 2:
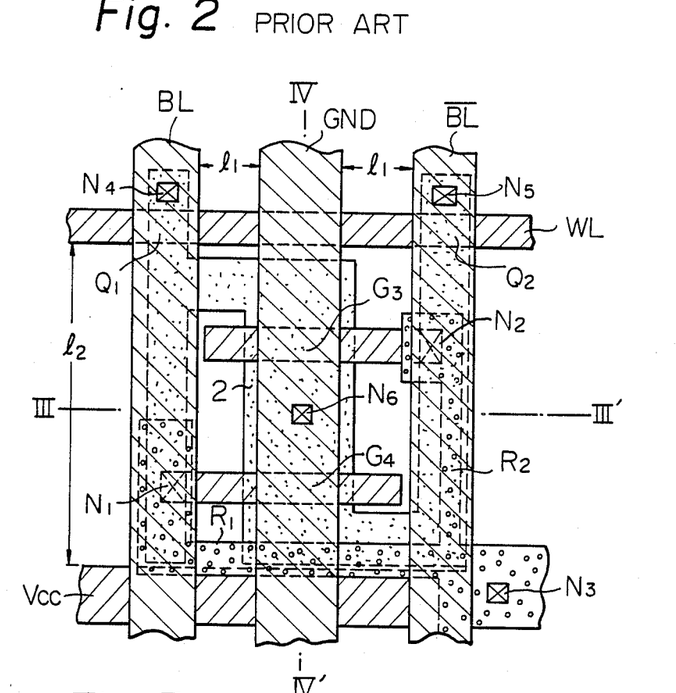
FIG. 2 is a plan view of a physical structure of a conventional static-type memory cell.
Figure 3:
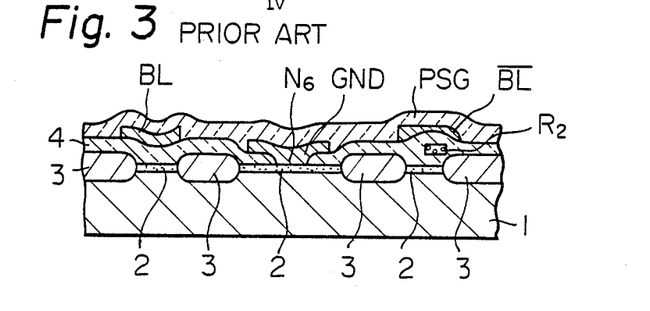
FIG. 3 is a cross-sectional view taken along line III—III' of FIG. 2.

FIG. 2 illustrates a conventional physical structure of the static-type memory cell of FIG. 1; FIG. 3 is a cross-sectional view taken along line III—III' of FIG. 2; and FIG. 4 is a cross-sectional view tken along line IV—IV' of FIG. 2.

Figure 4:
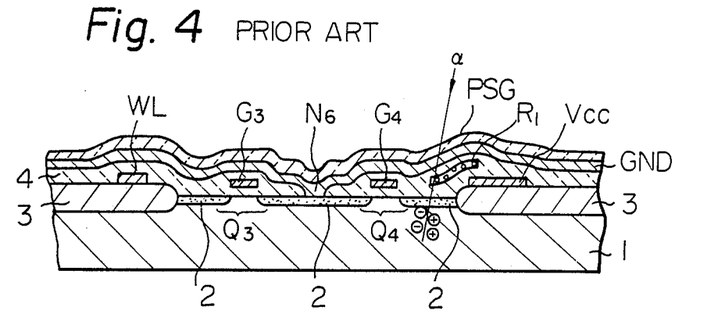
FIG. 4 is a cross-sectional view taken along line IV—IV' of FIG. 2.

Referring to FIGS. 2 through 4, a diffusion layer 2, which forms the source regions and the drain regions of the MOS transistors $Q_1$ through $Q_4$, is formed on the surface of a semiconductor substrate 1. Reference numerals 3 represent isolation regions formed on the surface of the semiconductor substrate 1. On the isolation regions 3, a word line WL and a power supply line $V_{CC}$, which are formed by polycrystalline silicon, extend in the row direction. Gate-electrode wiring lines $G_3$ and $G_4$ for the cross-coupled MOS transistors $Q_3$ and $Q_4$, the word line WL and the power supply line $V_{CC}$ are formed by the same polycrystalline layer formed on an insulating layer 4 on the semiconductor substrate 1. The gate-electrode wiring lines $G_3$ and $G_4$ are formed between and extend in parallel to the word line WL and the power supply line $V_{CC}$. The load resistors $R_1$ and $R_2$ are formed, by polycrystalline silicon having a fewer impurity ions, on a part of the diffusion layer 2 and on a part of the power supply line $V_{CC}$ on an insulating layer 4.

The gate-electrode wiring line $G_4$, one end of the load resistor $R_1$, and the diffusion layer 2 communicating with the drain region of the transistor $Q_3$ are in contact at a contact window $N_1$ corresponding to the node $N_1$ of FIG. 1. The gate-electrode wiring line $G_3$, one end of the load resistor $R_2$, and the diffusion layer 2 communicating with the drain region of the transistor $Q_4$ are in contact at a contact window $N_2$ corresponding to the node $N_2$ of FIG. 1. The other ends of the load resistors $R_1$ and $R_2$ are in contact with the power supply line $V_{CC}$ at a contact window $N_3$ corresponding to the node $N_3$ of FIG. 1.

A pair of bit lines BL and $\overline{BL}$ and the ground line GND are formed on an insulating layer 4 which covers the word line WL, the gate-electrode wiring lines $G_3$ and $G_4$, the load resistors $R_1$ and $R_2$, and the power supply line $V_{CC}$. The bit lines BL and $\overline{BL}$ and the ground line GND extend in the direction perpendicular to the direction of the word line WL, gate-electrode wiring lines $G_3$ and $G_4$, and the power supply line $V_{CC}$. The pair of bit lines BL and $\overline{BL}$ and the ground line GND are formed by patterning an aluminum layer. The bit line BL and the diffusion layer 2 under the bit line BL are in contact at a contact window $N_4$ corresponding to the node $N_4$ of FIG. 1.

The selecting transistor $Q_1$ is formed where the word line WL and the bit line BL cross. The selecting transistor $Q_2$ is formed where the word line WL and the bit line $\overline{BL}$ cross. The transistor $Q_3$ is formed where the gate-electrode wiring line $G_3$ and the ground line GND cross. The transistor $Q_4$ is formed where the gate-electrode wiring line $G_4$ and the ground line GND cross. The pair of bit lines BL and $\overline{BL}$ and the ground line GND are covered by a phospho-silicate glass layer PSG.

As is apparent from FIGS. 1 through 4, in the conventional structure, there are four wiring lines WL, $G_3$, $G_4$, and $V_{CC}$ formed of the same conductive layer of polycrystalline silicon and extending in the row direction, and there are three wiring lines BL, GND, and $\overline{BL}$ formed of the same conductive layer of aluminum and extending in the column direction.

Figure 5:
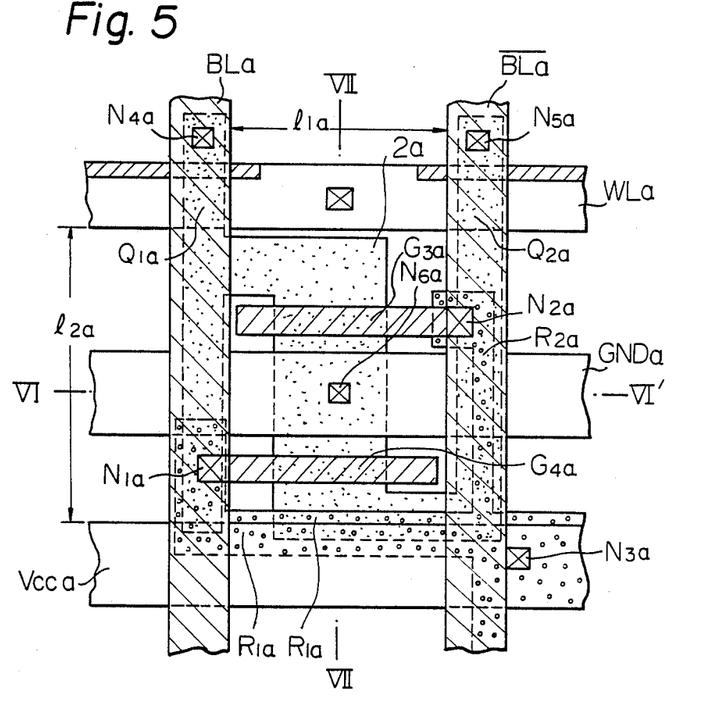
FIG. 5 is a plan view of a physical structure of a static-type memory cell, according to a first embodiment of the present invention.
Figure 6:
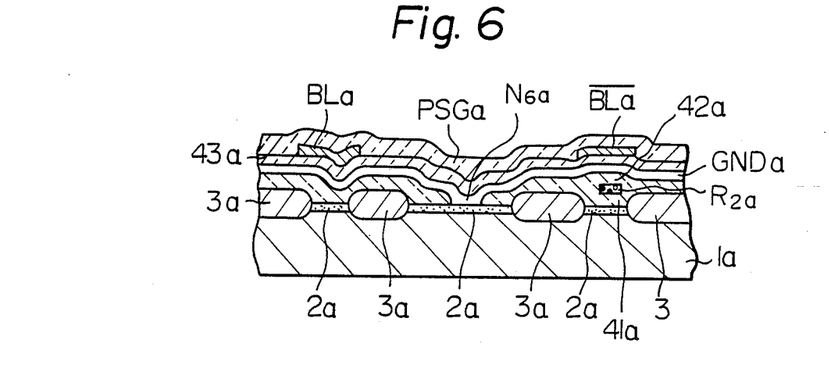
FIG. 6 is a cross-sectional view taken along line VI—VI' of FIG. 5.
Figure 7:
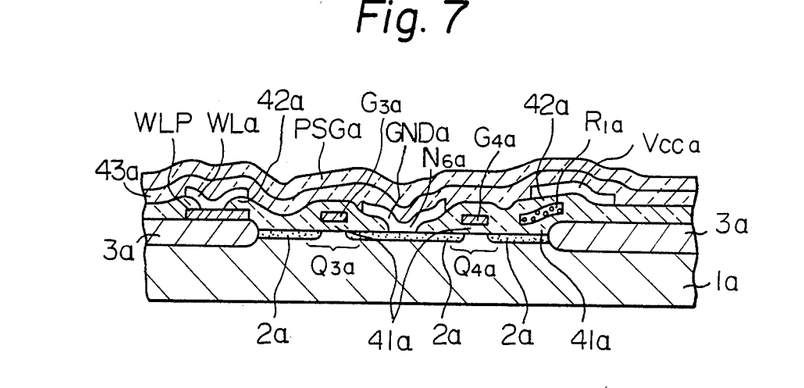
FIG. 7 is a cross-sectional view taken along line VII—VII' of FIG. 5.

Embodiments of the present invention will now be described in detail. FIG. 5 illustrates a physical structure of the static-type memory cell according to a first embodiment of the present invention; FIG. 6 is a cross-sectional view taken along line VI—VI' of FIG. 5; and FIG. 7 is a cross-sectional view taken along line VII—VII' of FIG. 5. The equivalent circuit diagram of the device of this embodiment is substantially the same as the conventional circuit diagram of FIG. 1. Elements in the device of this embodiment corresponding to those in the conventional device of FIGS. 1 through 4 are indicated by identical reference characters with an appended character "a".

Referring to FIGS. 5 through 7, reference characters $1a$, $2a$, and $3a$ represent a semiconductor substrate, an impurity diffusion layer, and isolation regions, respectively. They are substantially the same as those of the conventional device of FIGS. 2 through 4. A polycrystalline-silicon wiring layer WLP (FIG. 7) extends in the row direction on a part of the isolation regions $3a$. Gate-electrode wiring lines $G_{3a}$ and $G_{4a}$ for MOS transistors $Q_{3a}$ and $G_{4a}$ cross-coupled with each other are formed on an insulating layer $41a$ on the semiconductor substrate $1a$. The polycrystalline-silicon wiring layer WLP and the gate-electrode wiring lines $G_{3a}$ and $G_{4a}$ are formed by a first conductive layer of polycrystalline silicon. Load resistors $R_{1a}$ and $R_{2a}$ are formed, by polycrystalline-silicon having fewer impurity ions, on a part of the diffusion layer $2a$, on the insulating layer $41a$.

A word line $WL_a$, a ground line $GND_a$, and a power supply line $V_{CCa}$ are formed on an insulating layer $42a$ and pass through it to make contact with the polycrystalline-silicon wiring layer WLP, the impurity diffusion layer, and on the load resistors $R_{1a}$ and $R_{2a}$. These lines $WL_a$, $GND_a$, and $V_{CCa}$ extend in parallel to the lines $G_{3a}$ and $G_{4a}$ and are formed of a second conductive layer of good conductive material such as molybdenum, tungsten, or aluminum. A pair of bit lines $BL_a$ and $\overline{BL}_a$ are formed on an insulating layer $43a$ on the lines $WL_a$, $GND_a$, and $V_{CCa}$. The pair of bit lines $BL_a$ and $\overline{BL}_a$ extend in the column direction perpendicular to the row direction of the lines $WL_a$, $GND_a$, and $V_{CCa}$. The pair of the bit lines $BL_a$ and $\overline{BL}_a$ are formed of a third good conductive layer of, for example, aluminum. The pair of the bit lines $BL_a$ and $\overline{BL}_a$ are covered by a phospho-silicate glass layer PSG in a similar way as in the conventional device. Contact windows $N_{1a}$ through $N_{5a}$ are provided in a similar way as in the conventional device.

As will be seen by comparing the embodiment of the present invention illustrated in FIGS. 5 through 7 with the conventional example illustrated in FIGS. 2 through 4, there are conventionally three wiring lines BL, GND, and $\overline{BL}$ extending in the column direction in each column of the device. In contrast, in the embodiment of the present invention, only two wiring lines $BL_a$ and $\overline{BL}_a$ extend in the column direction in each column. Therefore, assuming the same size memory cell in the embodiment shown in FIG. 5 as the conventional memory cell shown in FIG. 2, the device of this embodiment can have a larger distance $l_{1a}$ between two adjacent wiring lines $BL_a$ and $\overline{BL}_a$ in the column direction than the distance $l_1$ between two adjacent wiring lines BL and GND or $\overline{BL}$ and GND in the column direction in the conventional device shown in FIG. 2. This makes it easier to form the pair of bit lines $BL_a$ and $\overline{BL}_a$ of the embodiment than to form the conventional bit lines BL and $\overline{BL}$. This in turn improves the manufacturing yield of static-type semiconductor memory devices.

When the distance $l_{1a}$ between two adjacent wiring lines $BL_a$ and $\overline{BL}_a$ is made equal to the conventional distance $l_1$ between two adjacent lines extending in the column direction, the distance $l_{1a}$ between the bit lines $BL_a$ and $\overline{BL}_a$ becomes approximately one-half of the distance between the conventional bit lines BL and $\overline{BL}$, i.e., $l_{1a} \approx (l_1 + l_1)/2$ resulting in a great improvement in the degree of integration.

In the row direction in the conventional example of FIG. 2, the power supply line $V_{CC}$ acts as a mask for impurity ions when the impurity diffusion layer 2 is formed. Therefore, as can be seen from FIGS. 2 and 4, the conventional power supply line $V_{CC}$ is formed outside the diffusion layer 2. In contrast, in the embodiment of the present invention, the power supply line $V_{CCa}$ is formed by the second conductive layer after the diffusion layer 2 is formed. Therefore, it is possible to form the power supply line $V_{CCa}$ to cover or overlap a part of the diffusion layer $2a$. Thus, as can be seen from FIGS. 5 and 7, the power supply line $V_{CCa}$ is formed to cover a part of the diffusion layer $2a$. By this construction, the distance $l_{2a}$ between the word line $WL_a$ and the power supply line $V_{CCa}$ in FIG. 5 can be less than the conventional distance $l_2$ between the word line WL and the power supply line $V_{CC}$ in FIG. 2. This also results in an improvement of the degree of integration.

Further, in the conventional device, the word line WL as well as the power supply line $V_{CC}$ and the gate-electrode wiring lines $G_3$ and $G_4$ are formed of a polycrystalline-silicon layer which has a lower electrical conductivity than aluminum. In contrast, in this embodiment of the present invention, the word line $WL_a$ is formed of good conductive material, e.g., aluminum. Therefore, the time constant due to the capacitance and resistance of the word line $WL_a$ is smaller than that of the conventional word line WL. Thus, a higher speed of operation can be realized in the device of this embodiment.

It should be noted that the word line $WL_a$, the ground line $GND_a$, and the power supply line $V_{CCa}$ are not necessarily all formed of a single second conductive layer. According to the invention, just one or two of the word line $WL_a$, the ground line $GND_a$, and the power supply line $V_{CCa}$ may be formed of the second conductive layer. The other line or lines may be formed by another conductive layer.

Referring back to the conventional device illustrated in FIG. 4, when alpha particles pass through the drain region of the MOS transistor $Q_4$, electron-hole pairs are generated along the path of the alpha particles in the semiconductor substrate 1. The electrons of the electron-hole pairs generated in the depletion layer under the drain region are attracted to the drain region, which is a part of the diffusion layer 2 and to which a positive voltage is applied. When the drain region of the transistor $Q_4$, that is, the node $N_2$ in FIG. 1, stores positive charge at a high potential level, the amount of the positive charge at the node $N_2$ is decreased by the injection of the electrons due to the alpha particles. As mentioned in the earlier description of the prior art, recent advances in increasing the degree of integration of semiconductor memory devices have resulted in a corresponding decrease in the amount of charge the node $N_2$ or $N_1$ can store. Thus, injection of electrons into the drain region due to alpha particles can easily invert the potential at the node $N_2$ from the high level to the low level, resulting in soft errors.

To overcome this problem of soft errors in addition to the problems of manufacturing yield, degree of integration, and operating speed, there is provided another embodiment of the present invention.

Figure 8:
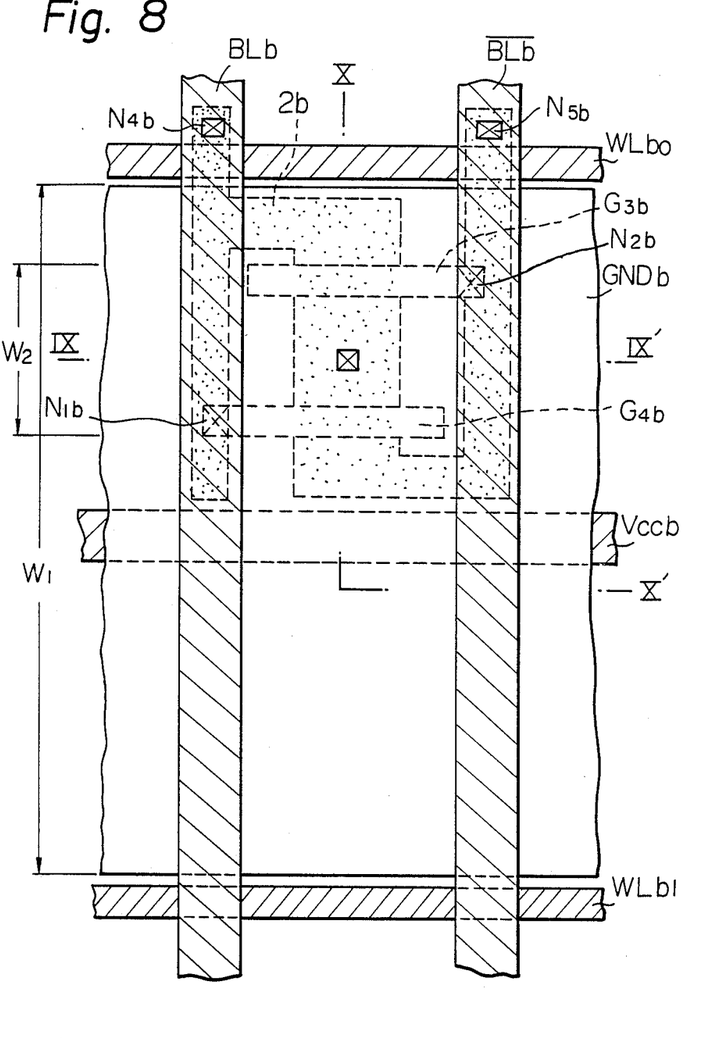
FIG. 8 is a plan view of a physical structure of a static-type memory cell, according to a second embodiment of the present invention.
Figure 9:
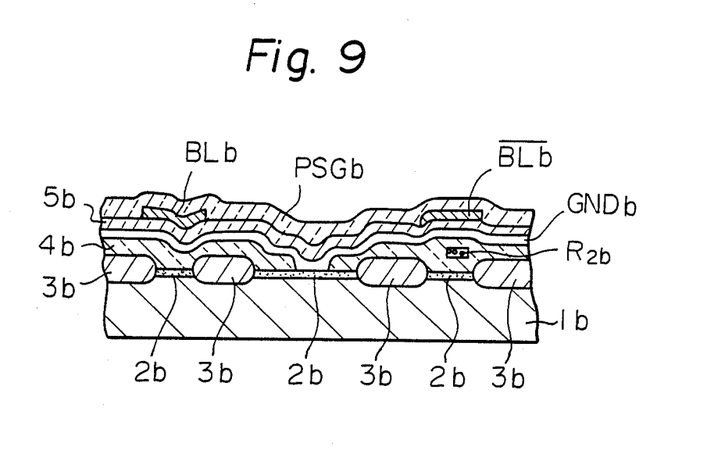
FIG. 9 is a cross-sectional view taken along line IX—IX' of FIG. 8.
Figure 10:
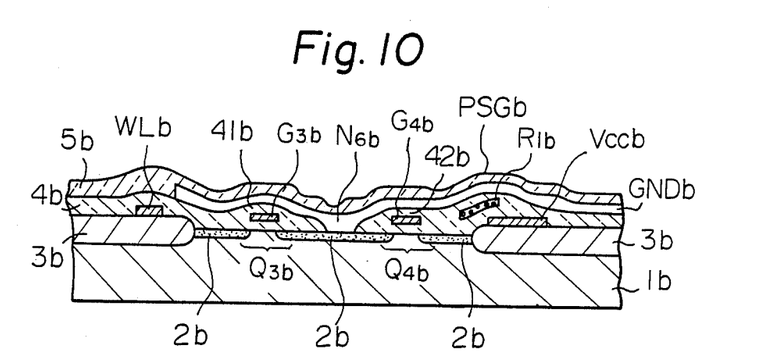
FIG. 10 is a cross-sectional view taken along line X—X' of FIG. 8.

FIG. 8 is a plan view of a static-type memory cell according to a second embodiment of the present invention; FIG. 9 is a cross-sectional view taken along line IX—IX' of FIG. 8; and FIG. 10 is a cross-sectional view taken along line X—X' of FIG. 8. The equivalent circuit diagram of the device of this second embodiment is substantially the same as the conventional circuit diagram of FIG. 1. Elements in the second embodiment corresponding to those in the conventional device are indicated by identical reference characters with an appended character "b".

Referring to FIGS. 8 through 10, reference characters $1b$, $2b$, and $3b$ represent a semiconductor substrate, an impurity diffusiion layer, and isolation regions. Similar to the conventional device illustrated in FIG. 2, a word line $WL_{b0}$ and a power supply line $V_{CCb}$ are formed by a polycrystalline-silicon layer and extend in the row direction on the isolation regions $3b$. Gate-electrode wiring lines $G_{3b}$ and $G_{4b}$ for cross-coupled MOS transistors $Q_{3b}$ and $Q_{4b}$ are formed on an insulating layer $4b$ on the semiconductor substrate $1b$ and between the word line $WL_{b0}$ and the power supply line $V_{CCb}$, by he same polycrystalline-silicon layer as that for the word line $WL_{b0}$ and the power supply line $V_{CCb}$. Load resistors $R_{1b}$ and $R_{2b}$ are formed, by polycrystalline silicon having fewer impurity ions, on the insulating layer $4b$ on a part of the diffusion layer $2b$. For the sake of simplicity, the load resistors $R_{1b}$ and $R_{2b}$ are not illustrated in FIG. 8.

According to the present invention, a ground line $GND_b$ with wide width $W_1$ is formed to cover the gate-electrode wiring lines $G_{3b}$ and $G_{4b}$, the diffusion layer $2b$, the load resistors $R_{1b}$ and $R_{2b}$, and the power supply line $V_{CCb}$ and extends in the row direction in parallel to the word line $WL_b$. The ground line $GND_b$ is of good conductive material such as aluminum, tungsten, or molybdenum.

In FIG. 8, two adjacent rows are illustrated, the upper row including the word line $WL_{b0}$, the diffusion layer $2b$, the gate-electrode wiring lines $G_{3b}$ and $G_{4b}$, and the power supply line $V_{CCb}$; and the lower row including the power supply line $V_{CCb}$, another diffusion layer (not shown), gate-electrode wiring lines (not shown), and another word line $WL_{b1}$. The not-shown diffusion layer and the gate-electrode wiring lines are arranged symmetrically in the lower row with respect to the power supply line $V_{CCb}$. The width $W_1$ of the ground line $GND_b$ in this second embodiment is nearly equal to the distance between the adjacent word lines $WL_{b0}$ and $WL_{b1}$.

A pair of bit lines $BL_b$ and $\overline{BL}_b$ are formed on the insulating layer $5b$ on the ground line $GND_b$ and extend in the column direction. The bit lines $BL_b$ and $\overline{BL}_b$ are covered by a phospho-silicate glass layer $PSG_b$.

In the conventional device shown in FIG. 2, the ground line GND is formed of the same conductive layer as the pair of bit lines BL and $\overline{BL}$ and extends in the column direction. In this second embodiment, the ground line $GND_b$ is formed of a conductive layer different from the layer for the pair of bit lines $BL_b$ and $\overline{BL}_b$ and extends in the row direction. Since the ground line $GND_b$ covers the gate-electrode wiring lines $G_{3b}$ and $G_{4b}$ and the drain regions of the transistors $Q_{3b}$ and $Q_{4b}$, electrostatic capacitances are formed between the ground line $GND_b$ and each of the gate electrodes of the transistors $Q_{3b}$ and $Q_{4b}$ and between the ground line $GND_b$ and each of the drain regions of the transistors $Q_{3b}$ and $Q_{4b}$. These electrostatic capacitances are added to the conventional electrostatic capacitances between each of the gate electrodes of the transistors $Q_{3b}$ and $Q_{4b}$ and the semiconductor substrate $1b$ and between each of the drain regions of the transistors $Q_{3b}$ and $Q_{4b}$ and the semiconductor substrate $1b$. That is, the electrostatic capacitances at the nodes $N_{1b}$ and $N_{2b}$ are greater than those at the corresponding conventional nodes $N_1$ and $N_2$ in FIG. 1. Therefore, the amount of charge which can be stored in the cross-coupled MOS transistors $Q_{3b}$ and $Q_{4b}$ is greater than that in the conventional device. Accordingly, in this second embodiment, soft errors due to alpha particles, i.e., inversion of stored information due to alpha particles, hardly occur.

In order to increase the electrostatic capacitances at the node $N_{1b}$ and $N_{2b}$, the insulating layer $41b$ between the ground line $GND_b$ and the gate-electrode wiring line $G_{3b}$ and the thickness of insulating layer $42b$ between the ground line $GND_b$ and the gate-electrode wiring line $G_{4b}$ are made as thin as possible. Preferably, they are made thinner than the second insulating layer $5b$ between the pair of bit lines $BL_b$ and $\overline{BL}_b$ and the ground line $GND_b$.

In the illustrated second embodiment, the ground line $GND_b$ is formed to have the width $W_1$ to cover all of the polycrystalline-silicon wirings, i.e., $G_{3b}$, $G_{4b}$, and $V_{CC}$, except for the word lines $WL_{b0}$ and $WL_{b1}$, and to cover the diffusion layer except for the portion under the word line $WL_{b0}$. However, it is not necessary to have such a wide width $W_1$. The width of the ground line $GND_b$ may be $W_2$ (FIG. 8) to cover just the gate-electrode wiring line $G_{3b}$, the contact window $N_{2b}$, the gate-electrode wiring line $G_{4b}$, and the contact window $N_{1b}$. A ground line $GND_b$ having such a width $W_2$ can also prevent soft errors due to alpha particles. A ground line $GND_b$ having a width $W_1$ or $W_2$ can be easily formed in comparison with the conventional ground line GND (FIG. 1) or the ground line $GND_a$ (FIG. 5) having a narrow width.

It will be easily seen that, in the second embodiment, the effects obtained in the first embodiment, i.e., improved yield in manufacturing static-type semiconductor memory devices, improved integration degree, and improved operating speed, can also be obtained, because, for each column, the number of wiring lines is decreased to two, i.e., $BL_b$ and $\overline{BL}_b$, and the ground line $GND_b$ is made of good conductive material such as aluminum, tungsten, or molybdenum.

Figure 11:
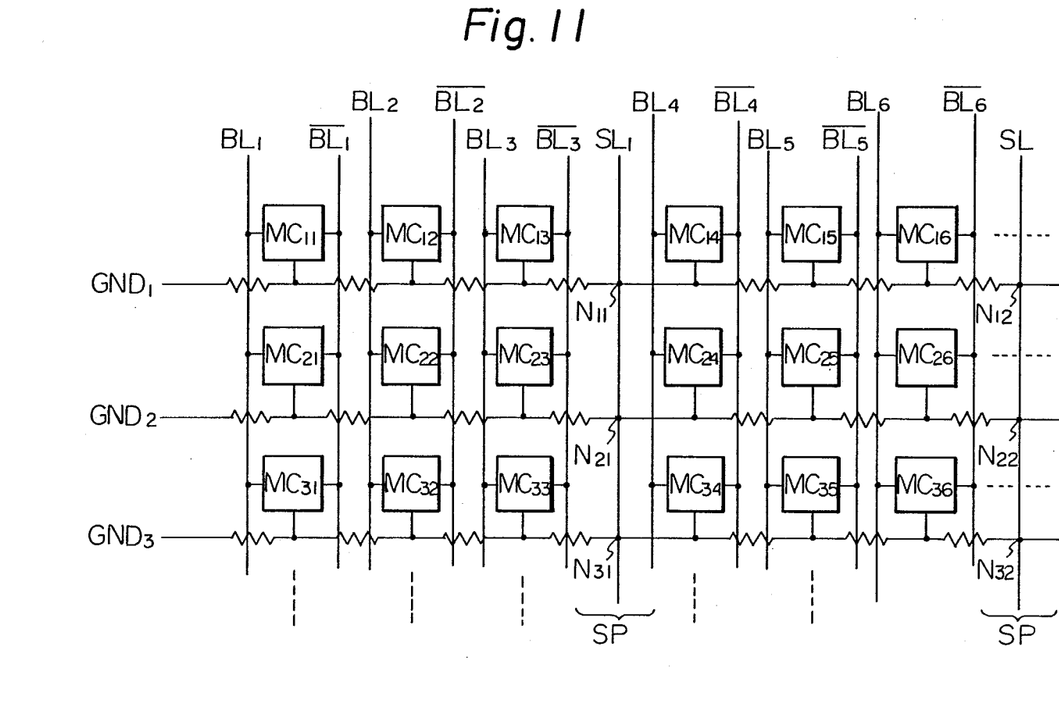
FIG. 11 is a block circuit diagram of a main portion of the static-type semiconductor memory device of the first or second embodiments illustrated in FIGS. 5 through 7 or in FIGS. 8 through 10.

FIG. 11 is a block circuit diagram illustrating a main portion of the static-type semiconductor memory device including the memory cells of the first embodiment illustrated in FIGS. 5 through 7 or the second embodiment illustrated in FIGS. 8 through 10. In FIG. 11, static-type memory cells $MC_{11}$, $MC_{21}$, $MC_{31}$, - - - , $MC_{12}$, $MC_{22}$, $MC_{32}$, - - - are arranged in a matrix. To the memory cells $MC_{11}$, $MC_{21}$, $MC_{31}$, - - - in the first column, a pair of bit lines $BL_1$ and $\overline{BL}_1$ are connected. Similarly, to the memory cells $MC_{12}$, $MC_{22}$, $MC_{32}$, - - - in the second column, another pair of bit lines $BL_2$ and $\overline{BL}_2$ are connected. To the memory cells in the third column, in the fourth column, and so on, a corresponding pair of bit lines are connected.

Conventionally, ground lines are formed by the same conductive layer as for the bit lines and extend in parallel to the bit lines. In contrast, in the aforementioned embodiments of the present invention, the ground lines can be formed of a conductive layer different from the conductive layer for the bit lines, so that the memory device has a laminated structure. This laminated structure enables the ground lines $GND_1$, $GND_2$, - - - to be arranged to extend in the direction perpendicular to the extending direction of the bit lines, as shown in FIG. 11. The ground line $GND_1$ is connected to the memory cells $MC_{11}$, $MC_{12}$, - - - arranged in the first row, at nodes $N_{11}$, $N_{12}$, - - -, respectively. Similarly, the ground lines $GND_2$, $GND_3$, - - - are connected to the memory cells arranged in the second row, third row, - - -, respectively.

In the first and the second embodiment, the ground line is formed of a good conductive material such as aluminum, tungsten, and molybdenum. The ground lines, however, do not necessarily have to be formed of such a good conductive material. In the present invention, it is sufficient that the ground lines be formed by a conductive layer different from the conductive layer for forming the bit lines. When, for example, the ground lines $GND_1$, $GND_2$, - - - are formed of a conductive layer having a relatively high resistivity, for example, polycrystalline-silicon, it is necessary to short-circuit the ground lines with a conductive layer having a relatively low resistivity, for example, aluminum, so as to compensate for the resistances of the ground lines.

In FIG. 11, short-circuiting lines $SL_1$, $SL_2$, - - -, formed of the same conductive layer as the conductive layer for forming the bit lines $BL_1$, $\overline{BL}_1$, $BL_2$, $\overline{BL}_2$, - - -, are arranged in parallel to the bit lines. These short-circuiting lines $SL_1$, $SL_2$, - - - are arranged to have a predetermined space therebetween. In FIG. 11, as an example, the predetermined space corresponds to the space for three memory cells in the row direction.

The short-circuit line $SL_1$ is connected to the ground lines $GND_1$, $GND_2$, $GND_3$, - - -, at the nodes $N_{11}$, $N_{21}$, $N_{31}$, - - -, respectively; and the ground line $SL_2$ is connected to the ground lines $GND_1$, $GND_2$, $GND_3$, - - -, at the nodes $N_{12}$, $N_{22}$, $N_{32}$, - - -, respectively.

The wiring arrangement shown in FIG. 11 has the disadvantage that, in order to place the short-circuiting lines $SL_1$, $SL_2$, - - -, additional spaces SP must be provided in the memory device. These additional spaces severely limit the integration degree of the static-type semiconductor memory device.

Figure 12:
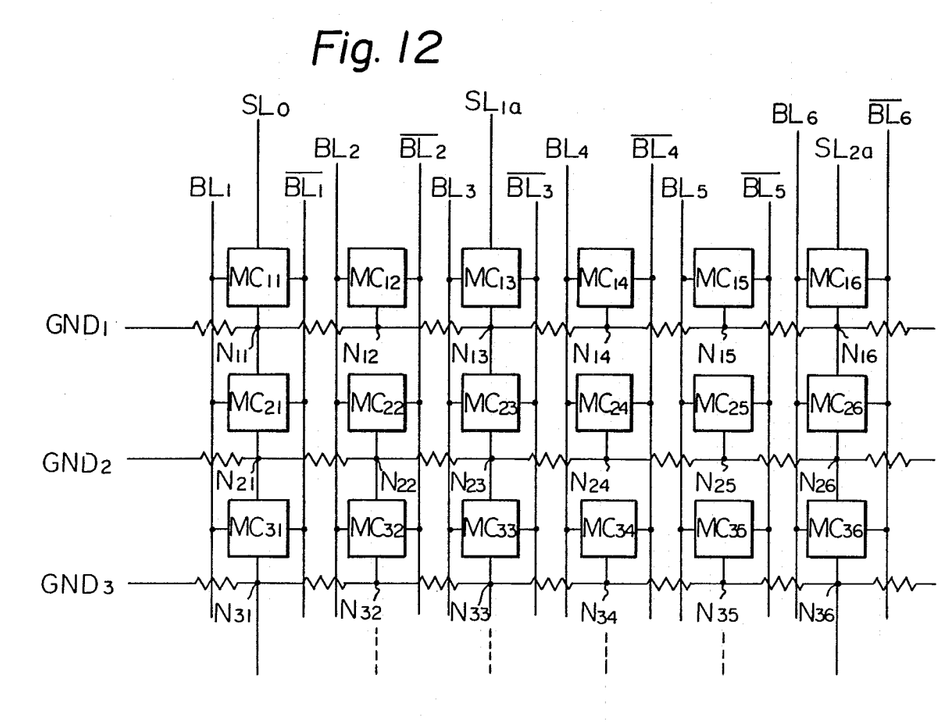
FIG. 12 is a block circuit diagram of a main portion of a static-type semiconductor memory device, according to a third embodiment of the present invention.

To overcome the above disadvantage in the wiring arrangement of FIG. 11, there is provided a third embodiment as shown in FIG. 12. The main difference between FIG. 11 and FIG. 12 is that the short-circuiting lines $SL_1$, $SL_2$, - - - are replaced by short-circuiting lines $SL_{1a}$, $SL_{2a}$, - - - extending through the central portions of the memory cells $MC_{13}$, $MC_{23}$, $MC_{33}$, - - -, and $MC_{16}$, $MC_{26}$, $MC_{36}$, - - -, respectively. This wiring arrangement eliminates the additional spaces SP in FIG. 11. The short-circuiting lines $SL_{1a}$, $SL_{2a}$, - - - extend parallel to the bit lines and are arranged to have a predetermined space therebetween. The predetermined space corresponds to the space for, for example, three memory cells in the row direction. The elimination of the additional spaces SP reduces the requisite area for the memory device and enables a high integration degree. This is particularly true for memory devices of a large capacity.

The short-circuiting lines do not necessarily have to be arranged with the above-mentioned predetermined spaces. They may be provided in any column through the memory cells in the column. For example, a short-circuiting line $SL_0$ may be provided in the first column so as to extend through the memory cells $MC_{11}$, $MC_{21}$, $MC_{31}$, - - -, as shown in FIG. 12.

The equivalent circuit diagram of each memory cell in FIG. 12 is substantially the same as the conventional one illustrated in FIG. 1, except that the short-circuiting lines extend through the memory cells in the particular columns.

Figure 13:
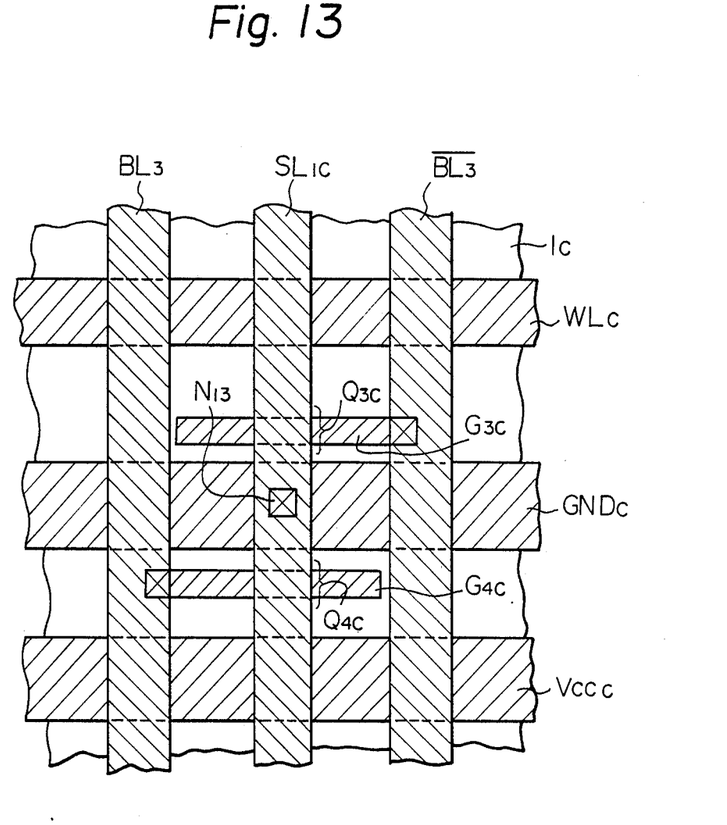
FIG. 13 is a plan view of a physical structure of a memory cell in the static-type semiconductor memory device of FIG. 12.

FIG. 13 is a plan view of the physical structure of one of the memory cells, $MC_{13}$, illustrated in FIG. 12. Elements in the memory cell of FIG. 13 corresponding to those in the memory cell of FIG. 5 are indicated by identical reference characters with an appended character "c". The main difference between the structure of the first embodiment shown in FIG. 5 and the structure of FIG. 13 is that, in FIG. 13, the short-circuiting line $SL_{1c}$ is provided between the bit lines $BL_3$ and $\overline{BL}_3$. The short-circuiting line $SL_{1c}$ is formed of the same conductive layer of, for example, aluminum, as the layer for forming the bit lines $BL_3$ and $\overline{BL}_3$ and extends parallel to the bit lines $BL_3$ and $\overline{BL}_3$. For the sake of simplicity, the diffusion layer the and resistors are not illustrated in FIG. 13.

The above-mentioned third embodiment is not limited to a static-type semiconductor memory device. Generally, in a semiconductor device having circuit units arranged in a matrix, a first wiring line for supplying a power supply voltage or a signal to each circuit unit and having a relatively high resistance, and a second wiring line perpendicular to the first wiring line and having a relatively low resistance, the effect of the third embodiment, i.e., the effect of eliminating the additional spaces SP, can be obtained by extending the second line through the circuit units.

From the foregoing description, it will be apparent that, according to the present invention, provision of a laminated structure with a good conductive layer different from the layer for the gate-electrode wiring lines for at least one of the group of word lines, power supply lines, and ground lines enables easy wiring, improved manufacturing yield, improved integration degree, and improved operating speed in a static-type semiconductor memory device.

Further, provision of the ground lines to cover the gate-electrode wiring lines in MOS transistors comprising flip-flops in memory cells in a static-type semiconductor memory device increases the amount of charge each memory cell can store and thus reduces soft errors due to alpha particles.

Still further, provision of wiring lines extending through the memory cells or circuit units enables improvement of the degree of integration not only in a static-type semiconductor memory device, but also in a general semiconductor device.

I claim:

1. A semiconductor memory device, comprising:
   a semiconductor substrate;
   a first insulating layer formed on the semiconductor substrate;
   a group of word lines formed on and insulated from said semiconductor substrate;
   a group of pairs of bit lines formed on and insulated from said semiconductor substrate;

a group of power supply lines formed on and insulated from said semiconductor substrate;

a group of ground lines formed on and insulated from said semiconductor substrate;

a plurality of static-type memory cells arranged in rows and columns, each comprising MIS transistors cross-coupled with each other, each of said memory cells being provided at a cross point between one of said word lines and one of said pairs of bit lines, each of said MIS transistors having a drain region and a gate electrode;

a plurality of gate-electrode wiring lines connecting and acting as the gate electrodes of said MIS transistors;

a first conductive layer formed on said first insulating layer, on said semiconductor substrate and for forming said gate-electrode wiring lines;

a second insulating layer formed on said first conductive layer and on said first insulating layer;

a second conductive layer, formed on said second insulating layer on said first conductive layer, for forming said ground lines which extend across said bit lines, respectively;

a third insulating layer formed on said second conductive layer and on said second insulating layer; and a third conductive layer formed on the third insulating layer and for forming said groups of pairs of bit lines.

2. A semiconductor memory devices as set forth in claim 1, wherein all of said word lines, said power supply lines, and said ground lines are formed from said second conductive layer.

3. A semiconductor memory device as set forth in claim 2, wherein said first conductive layer has a first resistivity, said second conductive layer has a second resistivity lower than or equal to said first resistivity, and said third conductive layer has a third resistivity lower than said first resistivity.

4. A semiconductor memory device as set forth in claim 3, wherein said first conductive layer is a polycrystalline-silicon layer, said second conductive layer is selected from among a tungsten layer, a molybdenum layer, an aluminum layer and a polycrystalline-silicon layer, and said third conductive layer is an aluminum layer.

5. A semiconductor memory device as set forth in claim 1, wherein each of said ground lines has a width smaller than the distance between two adjacent word lines and larger than the distance between two adjacent gate-electrode wiring lines in each row.

6. A semiconductor memory device as set forth in claim 2, further comprising a group of short-circuiting lines, formed from said third conductive layer, for short-circuiting said ground lines, each of said short-circuiting lines extending between the bit lines in one of said pairs of bit lines and interconnecting said ground lines.

7. A semiconductor memory device as set forth in claim 6, wherein said memory cells include a left-most column and one of said short-circuiting lines extends between the bit lines in the left-most column of the memory cells.

8. A semiconductor memory device as set forth in claim 6, wherein said memory cells include a right-most column and one of said short-circuiting lines extends between the bit lines in the right-most column of the memory cells.

9. A semiconductor memory device as set forth in claim 6, wherein said second conductive layer is is polycrystalline-silicon layer and said third conductive layer is an aluminum layer.

10. A semiconductor memory device as set forth in claim 9, wherein said ground-line short-circuiting lines are spaced at regular intervals.

11. A semiconductor memory device, comprising:
a semiconductor substrate;
a diffusion layer, formed in said semiconductor substrate, for forming source regions and drain regions of MIS transistors;
a first insulation layer formed on said diffusion layer and on said semiconductor substrate;
a first conductive layer formed on said first insulating layer and on said diffusion layer and comprising gate-electrode wiring lines;
a second insulating layer formed on said first conductive layer and on said first insulating layer;
a second conductive layer, formed on said second insulating layer, comprising word lines extending in a first direction;
a third conductive layer, formed on said second insulating layer, comprising ground lines extending in the first direction;
a third insulating layer formed on said second conductive layer and said third conductive layer; and
a fourth conductive layer formed on said third insulating layer, comprising pairs of bit lines extending in a second direction different from the first direction, said pairs of bit lines and word lines forming cross points, the cross points being the location of memory cells formed by said MIS transistors cross-coupled by said gate-electrode wiring lines.

12. A semiconductor memory device as set forth in claim 4, wherein said ground lines have a width sufficient to cover said gate-electrode wiring lines and said drain regions.

13. A semiconductor memory device as set forth in claim 11, further comprising power supply lines formed on said second insulating layer, extending in the first direction and overlapping said diffusion layer.

* * * * *

UNITED STATES PATENT AND TRADEMARK OFFICE
CERTIFICATE OF CORRECTION

PATENT NO. : 4,809,046

DATED : February 28, 1989

INVENTOR(S) : Aoyama et al.

It is certified that error appears in the above-identified patent and that said Letters Patent is hereby corrected as shown below:

| | |
|---|---|
| Col. 1, | line 17, "layer," should be --layer--. |
| Col. 2, | line 27, "lines and" should be --lines, and--; |
| | line 32, "electrode a" should be --electrode to which a--; |
| | line 33, delete "to which"; |
| | line 33, "lines" should be --line--; |
| | line 36, "substrate at" should be --substrate. At--; |
| | line 64, after "by" insert --the--. |
| Col. 4, | line 17, after "in" insert --parallel in--; |
| | line 26, delete "a". |
| Col. 5, | line 37, delete "on"; |
| | line 63, "$1_{1a}$" should be --$\ell_{1a}$--; |
| | line 65, "$1_1$" should be --$\ell_1$--. |
| Col. 6, | line 4, "$1_{1a}$" should be --$\ell_{1a}$--; |
| | line 6, "$1_1$" should be --$\ell_1$--; |
| | line 7, "$1_{1a}$" should be --$\ell_{1a}$--; |
| | line 10, "1" (all occurrences) should be --$\ell$--; |
| | line 25, "$1_{2a}$" should be --$\ell_{2a}$--; |
| | line 27, "$12$" should be --$\ell_2$--. |
| Col. 7, | line 20, "diffusiion" should be --diffusion--; |
| | line 28, "he" should be --the--. |

UNITED STATES PATENT AND TRADEMARK OFFICE
CERTIFICATE OF CORRECTION

PATENT NO. : 4,809,046

DATED : February 28, 1989

INVENTOR(S) : Aoyama et al.

It is certified that error appears in the above-identified patent and that said Letters Patent is hereby corrected as shown below:

Col. 9,   line 40, "short-circuit" should be --short-circuiting--;

line 42, "ground" should be --short-circuiting--.

Col. 10,  line 26, "the and" should be --and the--.

Col. 11,  line 11, "electrode;" should be --electrode, said ground lines covering at least a substantial portion of one of the drain region and gate electrode of said MIS transistors;--;

line 16, "layer," should be --layer--;

line 30, "devices" should be --device--.

Signed and Sealed this

Twelfth Day of December, 1989

Attest:

JEFFREY M. SAMUELS

Attesting Officer    Acting Commissioner of Patents and Trademarks